(12) United States Patent
Boulharts et al.

(10) Patent No.: US 9,543,841 B2
(45) Date of Patent: Jan. 10, 2017

(54) CONTROL DEVICE EMPLOYED IN A SWITCHED ELECTRICAL POWER SUPPLY SYSTEM

(71) Applicant: Schneider Toshiba Inverter Europe SAS, Pacy sur Eure (FR)

(72) Inventors: Hocine Boulharts, Triel sur Seine (FR); Allan Pierre Barauna, Vernon (FR)

(73) Assignee: SCHNEIDER TOSHIBA INVERTER EUROPE SAS, Pacy sur Eure (FR)

( * ) Notice: Subject to any disclaimer, the term of this patent is extended or adjusted under 35 U.S.C. 154(b) by 376 days.

(21) Appl. No.: 13/795,319

(22) Filed: Mar. 12, 2013

(65) Prior Publication Data

US 2013/0258721 A1 Oct. 3, 2013

(30) Foreign Application Priority Data

Mar. 30, 2012 (FR) ...................... 12 52956

(51) Int. Cl.
*H02M 3/335* (2006.01)
*H03K 17/10* (2006.01)
*H02M 5/458* (2006.01)
*H03K 17/74* (2006.01)

(52) U.S. Cl.
CPC ......... *H02M 3/335* (2013.01); *H02M 3/33538* (2013.01); *H02M 5/458* (2013.01); *H03K 17/102* (2013.01); *H03K 17/74* (2013.01)

(58) Field of Classification Search
CPC .. H02M 3/335; H02M 3/33538; H02M 5/458; H03K 17/74; H03K 17/102
USPC ....... 323/282, 351; 327/419–437; 363/21.12, 363/21.15, 34, 35, 37
See application file for complete search history.

(56) References Cited

U.S. PATENT DOCUMENTS

| | | | |
|---|---|---|---|
| 4,394,590 A | | 7/1983 | Honda |
| 4,692,643 A | * | 9/1987 | Tokunaga ............ H03K 17/102 327/436 |
| 4,695,770 A | * | 9/1987 | Raets ..................... H03K 17/64 315/207 |
| 5,148,064 A | * | 9/1992 | Kevorkian ........... H03K 17/102 327/427 |
| 5,227,781 A | | 7/1993 | Ninnis |
| 5,602,724 A | * | 2/1997 | Balakrishnan .......... H02M 1/34 363/21.15 |
| 6,005,415 A | | 12/1999 | Solomon |

(Continued)

FOREIGN PATENT DOCUMENTS

| | | |
|---|---|---|
| EP | 0 048 758 A1 | 4/1982 |
| FR | 2 673 494 A1 | 9/1992 |

OTHER PUBLICATIONS

U.S. Appl. No. 14/176,467, filed Feb. 10, 2014, Barauna, et al.

(Continued)

*Primary Examiner* — Gustavo Rosario Benitez
(74) *Attorney, Agent, or Firm* — Oblon, McClelland, Maier & Neustadt, L.L.P.

(57) ABSTRACT

The invention relates to a control device intended to be employed in a switched electrical power supply system, said system being able in particular to be employed in a variable speed drive to power its electronics. The control device comprises a first transistor intended to receive control signals originating from a control unit and a second transistor connected in series with the first transistor and provided with a floating-control gate.

17 Claims, 3 Drawing Sheets

(56) References Cited

U.S. PATENT DOCUMENTS

| | | | |
|---|---|---|---|
| 6,956,403 B2 * | 10/2005 | Janssen | H03K 17/6872 326/27 |
| 6,975,146 B1 * | 12/2005 | Schottler | 327/108 |
| 7,348,826 B1 | 3/2008 | Klein et al. | |
| 8,395,422 B2 * | 3/2013 | Ogawa | H03K 17/04123 327/109 |
| 2008/0106319 A1 * | 5/2008 | Bayerer | 327/432 |
| 2009/0212726 A1 * | 8/2009 | Baudesson et al. | 318/400.3 |

OTHER PUBLICATIONS

Herbert L. Hess, et al., Transformerless Capacitive Coupling of Gate Signals for Series Operation of Power MOS Devices, IEEE Transactions on Power Electronics, vol. 15, No. 5, XP011043427, Sep. 2000, pp. 923-930.

French Preliminary Search Report and Written Opinion issued Nov. 26, 2012, in French 1252956, filed Mar. 30, 2012 (with English Translation of Categories of Cited Documents).

\* cited by examiner

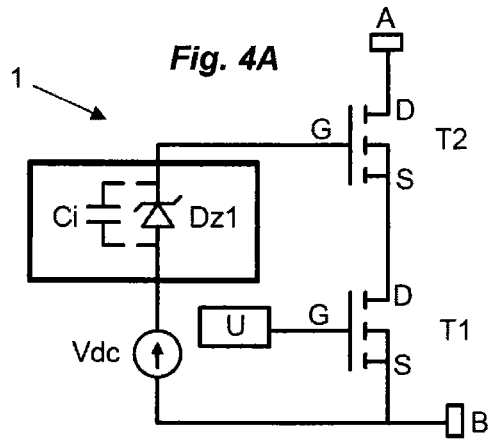
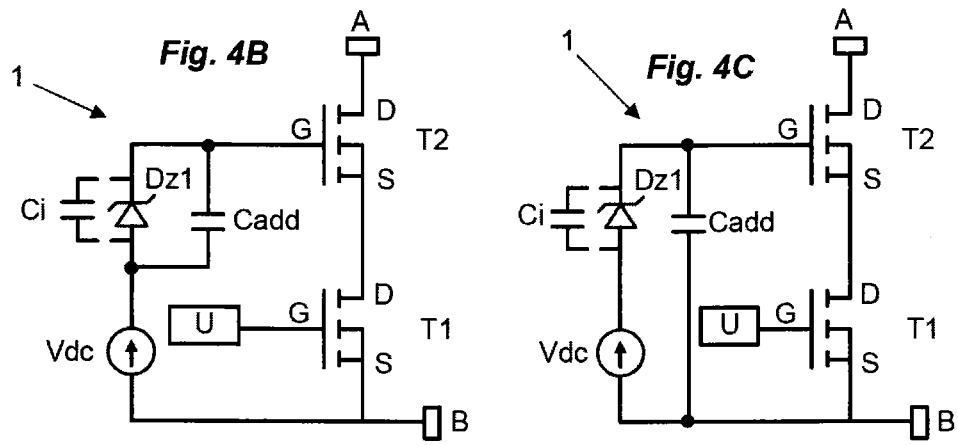
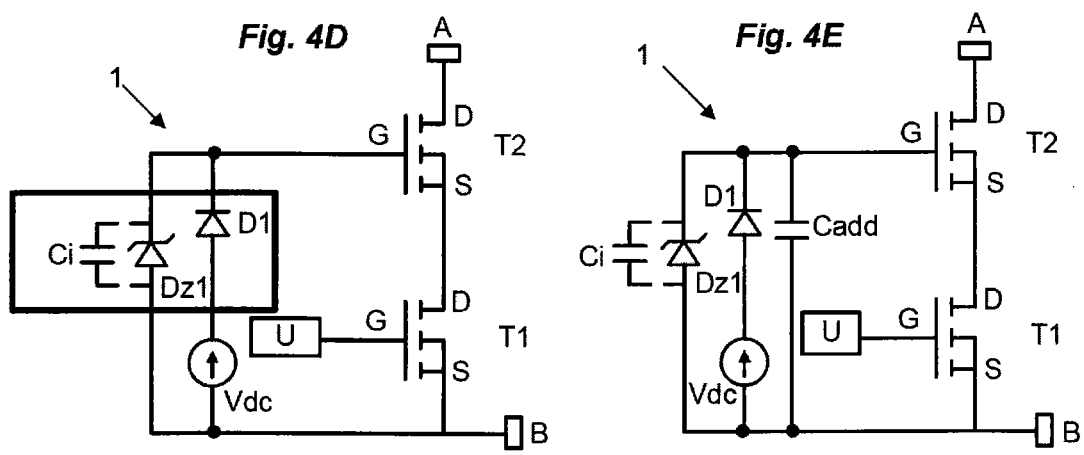

CONTROL DEVICE EMPLOYED IN A SWITCHED ELECTRICAL POWER SUPPLY SYSTEM

TECHNICAL FIELD OF THE INVENTION

The present invention pertains to a control device employed in a switched electrical power supply system. The invention also relates to the switched electrical power supply system employing said control device.

PRIOR ART

A switched electrical power supply system (also called SMPS for "Switched Mode Power Supply") makes it possible to deliver as output one or more DC voltages on the basis of a DC voltage tapped off at input. This type of switched electrical power supply system is in particular employed in a variable speed drive. In a variable speed drive, the switched electrical power supply system is then charged with providing an auxiliary DC voltage making it possible to power all the electronics of the variable speed drive, from a main DC voltage tapped off from the DC power supply bus of the variable speed drive.

The DC power supply bus provides a main DC voltage that may range from 350 Vcc to more than 1000 Vcc. The control device employed in the switched electrical power supply system must thus be able to switch a current of up to 2A under 1700 Vcc. In a known manner, the control device can comprise a single transistor of MOSFET type having a breakdown voltage of between 1200 V and 1700V. However, at these breakdown voltages, the MOSFET transistor is at its technological limits. Moreover, its cost is high and, during operation, its losses through the Joule effect are particularly high.

To alleviate these drawbacks, it is known to associate two MOSFET transistors in series, having lower breakdown voltages, ranging from 600V to 900V. Each of the two transistors in series thus supports a lesser electrical voltage, compatible with optimal employment of MOSFET technology.

In the prior art, several setups with two transistors in series have been proposed. The publication entitled *"Transformerless Capacitive Coupling of Gate Signals for Series Operation of Power MOS Devices"*—Robert L. Hess and Russel Jacob Baker—IEEE transactions on power electronics, vol. 15, No. 5, September 2000, describes a control device comprising at least two transistors of MOSFET type in series. This topology is represented in FIG. 1A. In this topology, the control device comprises two input terminals A, B and a first transistor T1 connected to the second input terminal B and receiving on its gate control signals originating from a control unit U. A second transistor T2 is connected in series with the first transistor T1 and to the first input terminal A. A capacitor C1 is connected between the gate of the second transistor T2 and the first input terminal A. The role of the capacitor C1 is two-fold: provide enough charge to control the second transistor and limit the voltage across the terminals of the first transistor to an optimal value.

So as not to be contingent on these two conditions, it has in particular been proposed to replace the capacitor by a Zener diode Dz1, which then makes it possible to fix the voltage across the terminals of the first transistor T1. This second known topology is represented in FIG. 1B. In this setup, the control of the second transistor T2 is then ensured by virtue of the charge stored up by the intrinsic capacitance (Ci) of the Zener diode Dz1. However, if the charge transmitted by the intrinsic capacitance of the Zener diode Dz1 is lower (due for example to a too low voltage of the DC bus) than the charge necessary to correctly control the second transistor T2, it is then necessary to add a capacitor in parallel with this Zener diode to ensure suitable control of the second transistor. By adding the capacitor in parallel with the Zener diode, the drawbacks identified in respect of the first setup make their reappearance.

In these two setups, the control of the second transistor T2 depends on the capacitance of the capacitor, whether the latter be intrinsic or additional, and the level of the voltage across the terminals of the capacitor. To control the second transistor T2 in an suitable manner, on the basis of a voltage which is low across the terminals of the capacitor (intrinsic to the Zener diode Dz1 or additional), it is necessary to increase the capacitance of the capacitor connected in series to the gate G of the transistor T2. However, the capacitance of the capacitor cannot be increased indefinitely.

The aim of the invention is to propose a control device with two transistors in series, intended to be employed in a switched electrical power supply system, the control device allowing suitable control of the second transistor whatever the level of the main DC voltage, and without increasing the capacitance of a capacitor.

DISCLOSURE OF THE INVENTION

This aim is achieved by a control device intended to be employed in a switched electrical power supply system to control a DC/DC converter of said switched electrical power supply system, said control device comprising a first input terminal and a second input terminal, a first transistor connected to the second input terminal and provided with a gate intended to receive control signals originating from a control unit and a second transistor connected to the first input terminal, in series with the first transistor, and provided with a floating-control gate, the control device comprising a control assembly connected to the gate of the second transistor and to the second input terminal and comprising a voltage source and a voltage clamping/routing device connected to the voltage source.

According to a particular feature, the voltage clamping/routing device comprises a Zener diode connected in series with the voltage source.

According to another particular feature, an additional capacitor is for example connected in parallel with the Zener diode alone.

According to another particular feature, the voltage clamping/routing device comprises a diode connected in series with the voltage source and a Zener diode connected in parallel with the voltage source and with said diode.

According to another particular feature, the additional capacitor is then connected in parallel with the control assembly, the control assembly being in the configuration Zener diode+voltage source in series or in the configuration diode+voltage source in series and Zener diode in parallel.

According to another particular feature, the device comprises one or more superimposed identical patterns, each pattern comprising:
- two connection points,
- a capacitor connected to a first connection point,
- a first Zener diode connected in series with said capacitor,
- a third transistor provided with a gate connected to said capacitor and with a source connected to a second connection point,
- a Zener diode connected between the gate and the source of the third transistor, the first added pattern being connected up by its second connection point to the drain of the second transistor and by its first connection point to the gate of the second transistor, each additional pattern being connected up by its second connection point to the drain of the transistor of the previous pattern and by its first connection point to the gate of the transistor of the previous pattern.

The invention also relates to a switched electrical power supply system comprising a first terminal and a second terminal between which is connected a DC voltage source, a DC/DC converter connected to the first terminal and a control device connected in series with the DC/DC converter and to the second terminal, said control device being in accordance with that defined hereinabove.

According to one embodiment, the DC/DC converter is of insulated "flyback" type.

According to another embodiment, the DC/DC converter is of insulated "forward" type.

According to another embodiment, the DC/DC converter is of boost type.

According to a last embodiment, the DC/DC converter is of buck type.

The invention also relates to a variable speed drive intended to control an electrical load, said variable speed drive comprising:
- a rectifier module intended to rectify an AC voltage provided by an electrical distribution network,
- a DC power supply bus connected to the rectifier module and comprising a first power supply line at positive electrical potential and a second power supply line at negative electrical potential between which is applied a main DC voltage provided by the rectifier module,
- a bus capacitor connected to the first power supply line and to the second power supply line,
- an inverter module comprising several switching transistors intended to convert the DC voltage available on the bus into a variable voltage destined for the electrical load,
- a switched electrical power supply system in accordance with that defined hereinabove, the first terminal of the switched electrical power supply system being connected to the first power supply line of the DC power supply bus and the second terminal of the switched electrical power supply system being connected to the second power supply line of the DC power supply bus.

BRIEF DESCRIPTION OF THE FIGURES

Other characteristics and advantages will become apparent in the detailed description which follows given with regard to the appended drawings in which:

FIGS. 4A to 4E represent a control device with two transistors in series, according to various alternative embodiments of the invention

DETAILED DESCRIPTION OF AT LEAST ONE EMBODIMENT

The solutions presented in FIGS. 1A and 1B form part of the prior art and have been described hereinabove, in the introductory part of the description.

Figure 1A:
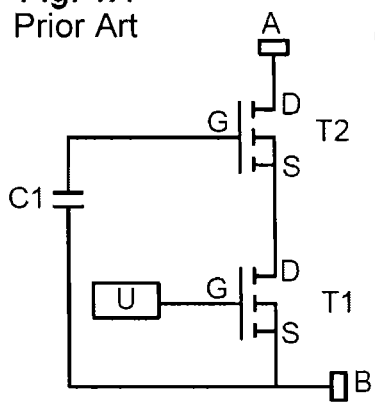
FIG. 1A represents a control device with two transistors in series, according to a first prior art.
Figure 1B:
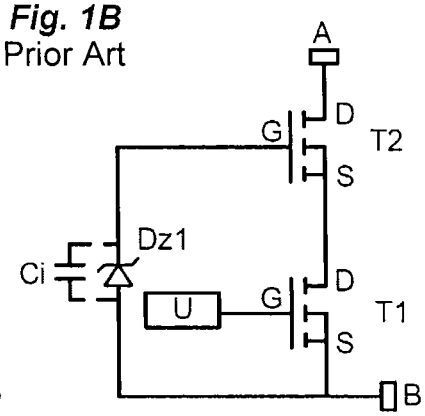
FIG. 1B represents a control device with two transistors in series, according to a second prior art.

In the subsequent description, certain references employed in the description of FIGS. 1A and 1B are preserved for the description of the invention, in so far as the components employed are identical and fulfil an identical function.

The invention relates to a control device 1 intended to be employed in a switched electrical power supply system. Such a switched electrical power supply system is employed in p variable speed drive, such as represented in FIG. 3.

Figure 3:
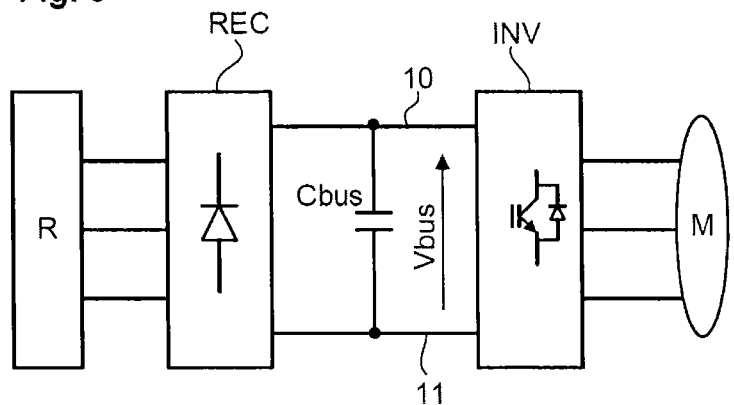
FIG. 3 represents a variable speed drive employing a switched electrical power supply system of the invention.

With reference to FIG. 3, a variable speed drive is powered from a three-phase electrical power supply network R delivering an AC voltage and is based on an AC/DC/AC topology (AC=Alternating Current, DC=Direct Current). A variable speed drive such as this thus comprises:
- a rectifier module REC intended to rectify the AC voltage provided by the network,
- a DC power supply bus connected to the rectifier module and comprising a first power supply line 10 at positive electrical potential and a second power supply line 11 at negative electrical potential between which is applied a main DC voltage Vbus provided by the rectifier module,
- a bus capacitor Cbus connected to the first power supply line 10 and to the second power supply line 11 and charged with maintaining the DC voltage Vbus at a constant value,
- an inverter module INV comprising several switching transistors intended to convert the DC voltage available on the bus into a variable voltage destined for an electrical load M.

The main DC voltage Vbus is employed to power the switched electrical power supply system. The switched electrical power supply system is in particular employed to provide a control voltage to the transistors of the inverter module INV.

Figure 2:
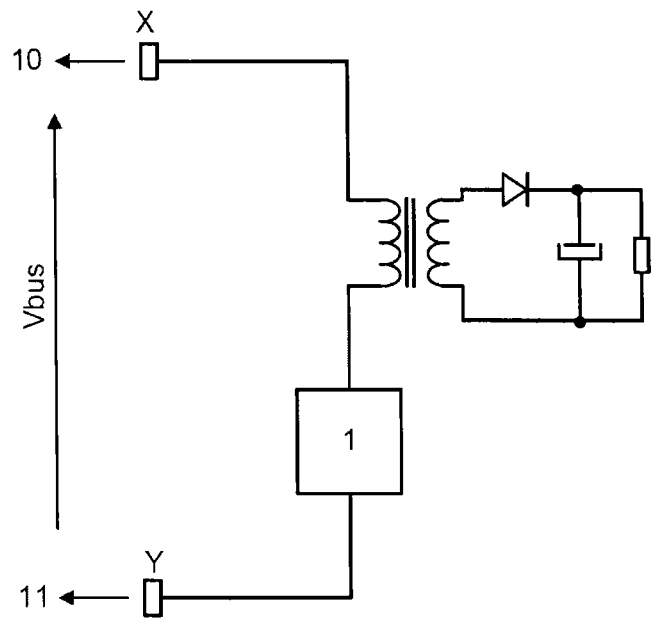
FIG. 2 represents a switched electrical power supply system.

A switched electrical power supply system, such as represented in FIG. 2, comprises a first terminal X intended to be connected to the first power supply line 10 and a second terminal Y intended to be connected to the second power supply line 11 of the DC power supply bus. The system comprises a DC/DC converter connected to its first terminal X and a control device 1 connected in series with the DC/DC converter and to its second terminal Y. The DC/DC converter can take the form of various known topologies, such as for example insulated "flyback", insulated "forward", buck or boost. FIG. 2 shows the association between the control device of the invention and a converter of "flyback" type.

With reference to FIG. 1A, the control device 1 of the invention comprises two input terminals A, B. The first input terminal A is intended to be connected to the DC/DC converter of the switched electrical power supply system and the second input terminal B is intended to be connected to the second terminal Y of the system.

The control device 1 comprises two transistors T1, T2 connected in series between its first input terminal A and its second input terminal B. Preferably, each of the transistors is a MOSFET, an IGBT or a transistor fabricated in a material with a large forbidden band energy ("wide-band gap material") such as silicon carbide or gallium nitride. Choosing two transistors in series makes it possible to halve the voltage supported across the terminals of each of the transistors, and therefore to decrease their cost and their bulk with respect to a single transistor supporting the entire voltage.

Each transistor T1, T2 possesses a gate G whose control enables a current to be passed between a drain D and a source S. As represented in FIG. 4A, the source S of the first transistor T1 is connected to the second input terminal B, the source S of the second transistor T2 is connected to the drain D of the first transistor T1 and the drain of the second transistor T2 is connected to the first input terminal A.

The gate G of the first transistor T1 is connected to a control unit U delivering control signals, for example of PWM (Pulse Width Modulation) type, to turn the first transistor T1 on or off. The gate G of the second transistor T2 is of floating-control type. Thus, it is connected to the second input terminal B through a specific control assembly, the subject of the invention.

This control assembly comprises a voltage source Vdc connected to the second input terminal and a voltage clamping/routing device connected to the voltage source Vdc and to the gate G of the second transistor T2.

In a first alternative embodiment represented in FIGS. 4A, 4B, 4C, the voltage clamping/routing device comprises a Zener diode Dz1 connected in series with the voltage source Vdc.

In a second alternative embodiment represented in FIGS. 4D and 4E, the voltage clamping/routing device comprises a diode D1 connected to the gate G of the second transistor T2 and in series with the voltage source Vdc and a Zener diode Dz1 connected in parallel with the voltage source Vdc and with the diode D1.

In FIGS. 4A to 4C, the Zener diode Dz1 plays a two-fold role: the role of voltage clamper to limit the voltage across the terminals of the first transistor T1 to the inverse voltage of the Zener diode Dz1 and the role of diode making it possible to route the voltage Vdc to the gate G of the second transistor T2 when the device is turned off.

The voltage source Vdc makes it possible to guarantee a sufficient voltage to control the second transistor T2, for example when starting up a switched electrical power supply system, even if the capacitance (intrinsic capacitor of the Zener diode) connected in series with is insufficient for the control of the second transistor T2.

With reference to FIGS. 4B, 4C, 4E, to limit the dissipation in the Zener diode Dz1, it is possible to add an additional capacitor Cadd. This additional capacitor Cadd is connected in parallel with the Zener diode alone (FIG. 4B) or in parallel with the whole control assembly (FIGS. 4C and 4E). The value of the capacitance of this additional capacitor Cadd is chosen so as to be able to synchronize the turning on of the two transistors and to represent a compromise between the losses generated in the first transistor T1 and the losses generated in the Zener diode Dz1.

According to the invention, the addition of the voltage source Vdc in the control of the gate G of the second transistor T2 thus removes any dimensioning constraint on an arbitrary capacitor connected in series. It makes it possible to guarantee the proper operation of the second transistor and to ensure that the latter passes the conduction threshold.

The operation of the control device such as represented in FIG. 4B, 4C or 4E is as follows:

Turning off:

At $t_0$: both transistors are on. The voltage across the terminals of the Zener diode Dz1 is applied to the terminals of the first transistor T1. The control unit U dispatches a turn-off signal to the gate of the first transistor T1.

Between $t_0$ and $t_1$: the first transistor T1 being in the process of turning off, the voltage across its terminals, between drain and source, decreases. This decrease forces the discharging of the capacitor across the terminals of the Zener diode Dz1 to the gate of the second transistor T2. A current then charges the gate G of the second transistor T2.

At $t_1$: when sufficient charge has accumulated on the gate G of the second transistor T2, the second transistor T2 turns off. The voltage source makes it possible to guarantee the passage of the conduction threshold of the second transistor T2.

Turning on:

At $t_0$: both transistors are off. The control unit U dispatches a turn-on signal to the gate G of the first transistor T1.

Between $t_0$ and $t_1$: the voltage across the terminals of the transistor T1 increases, causing an increase in the voltage across the terminals of the Zener diode Dz1. A current then flows from the gate of the transistor T2 to the Zener diode Dz1 and the capacitor, causing the discharging of the gate of the second transistor T2. The additional capacitor Cadd then makes it possible to store the discharge energy of the second transistor T2. The value of the capacitance of the additional capacitor Cadd is thus chosen so as to adjust the duration of switching on of the second transistor T2, for example so as to synchronize the turning on of the second transistor T2 with the turning on of the first transistor T1. For its part, the Zener diode Dz1 fixes the maximum voltage on the first transistor T1.

At $t_1$: both transistors are on.

Starting from the architectures described hereinabove, the invention also consists in cascading transistors above the second transistor T2.

To do this, it is possible to superimpose one or more identical patterns on the architecture described previously and comprising the two transistors T1, T2. The first pattern is connected to the gate G and to the drain D of the second transistor T2.

Figure 5:
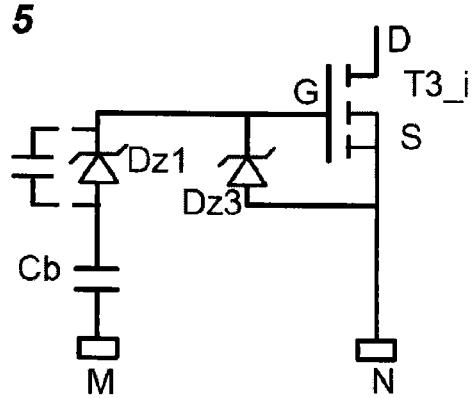
FIG. 5 represents a pattern that can be cascaded several times on the control device represented in FIGS. 4A to 4E.
Figure 6:
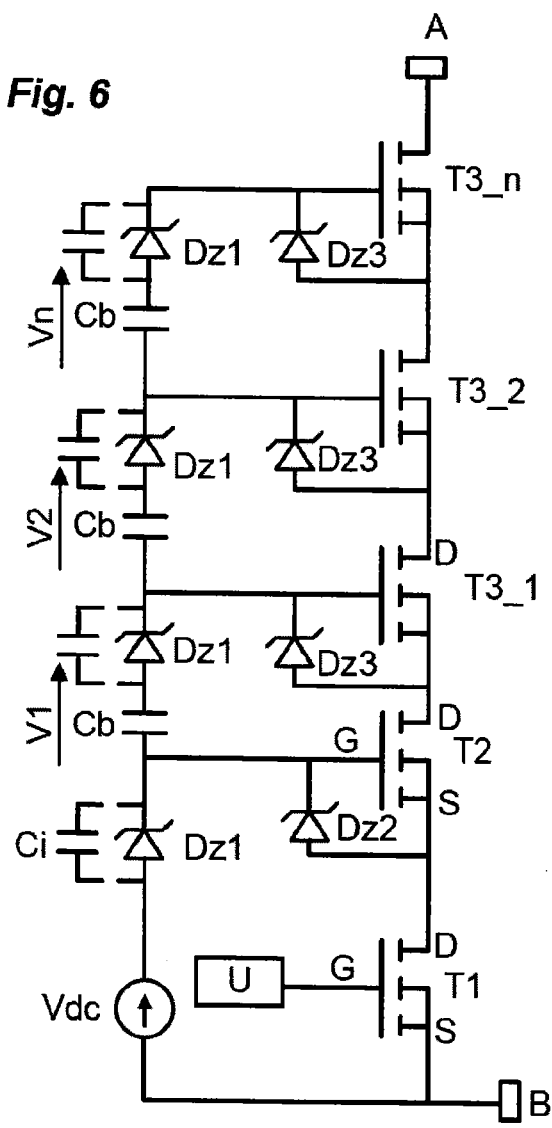
FIG. 6 represents a control device of the invention, comprising several transistors in cascade.

With reference to FIG. 5, a pattern comprises two connection points M, N. Each pattern comprises a capacitor Cb, connected to a first connection point M, a Zener diode Dz1, identical to the previous one so as to comply with the sharing of the voltages, connected in series with the capacitor Cb, a transistor T3_$i$ ($i$=1 to n), of the same type as the main transistors T1, T2, whose gate G is connected to the capacitor Cb, and whose source S is connected to a second connection point N. The pattern also comprises a Zener diode Dz3 (optionally identical to Dz2) connected between the gate G and the source S of the transistor T3_$i$.

Each added pattern is connected up by its second connection point N to the drain D of the transistor (T3_$n$−1) of the previous pattern and by its first connection point M to the gate G of the transistor (T3_$n$−1) of the previous pattern.

The drain D of the transistor of the last pattern (T3_$n$) is connected to the first input terminal A described hereinabove.

When the first transistor T1 is turned on by the control unit U, the stray capacitances of the transistors in cascade are charged by a current (coming from the converter). The voltage across the terminals of each transistor T3_$i$ is clamped to the voltage of its Zener diode Dz1. The Zener diodes conduct and charge the capacitors Cb of the patterns.

Upon turning off, the voltage across the terminals of each capacitor Cb of the patterns compensates for the voltage drops of the Zener diode under forward conduction (voltage VfwDz1) and of the subjacent transistor under conduction. This voltage Vn across the terminals of each capacitor Cb of a pattern is expressed in the following manner:

$$V1 = V_{Dz3} - (Vdc - Vfw_{Dz1}) + Vfw_{Dz1} + Id_{T2} * Rds_{on\_T2}$$

$$Vn = V_{Dz3} - (Vdc - Vfw_{Dz1}) + Vfw_{Dz1} + Id_{Tn-1} * Rds_{on\_Tn-1}$$

The invention thus pertains to a control device 1 having optimized operation, that can be employed in a switched electrical power supply system such as described hereinabove. Such a system can in particular be employed in a variable speed drive such as described hereinabove.

The invention claimed is:

1. A control device comprising:
    a first input terminal;
    a second input terminal;
    a first transistor connected to the second input terminal and provided with a gate intended to receive control signals originating from a control unit;
    a second transistor connected to the first input terminal and provided with a floating control gate, the first transistor and the second transistor connected in series between the first input terminal and the second input terminal; and
    a control assembly connected between the gate of the second transistor and the second input terminal and comprising a voltage source and a voltage clamping/routing device connected to the voltage source, the voltage source directly connected to a source of the first transistor, wherein
    the voltage clamping/routing device comprises a Zener diode connected in parallel with a capacitor,
    a first end of the Zener diode and a first end of the capacitor are connected to the gate of the second transistor and are not connected to the voltage source, and
    a second end of the Zener diode and a second end of the capacitor are connected to the voltage source.

2. The control device according to claim 1, wherein the Zener diode is connected in series with the voltage source.

3. The control device according to claim 1, wherein
    the voltage clamping/routing device further comprises a diode connected in series with the voltage source, and
    the Zener diode is connected in parallel with the voltage source and with the diode.

4. The control device according to claim 2 or 3, wherein a second capacitor is connected in parallel with the control assembly.

5. The control device according to claim 1, further comprising at least one superimposed identical patterns, each pattern of the at least one superimposed identical patterns comprising:
    two connection points;
    a second capacitor connected to a first connection point;
    a second Zener diode connected in series with said second capacitor;
    a third transistor provided with a gate connected to said capacitor and with a source connected to a second connection point; and
    a third Zener diode connected between the gate and the source of the third transistor, wherein
    a first added pattern is connected up by its second connection point to a drain of the second transistor and by its first connection point to the gate of the second transistor, and
    each additional pattern is connected up by its second connection point to the drain of the third transistor of a previous pattern and by its first connection point to the gate of the third transistor of the previous pattern.

6. A switched electrical power supply system comprising:
    a first terminal and a second terminal between which is connected a DC voltage source and the DC/DC converter connected to the first terminal, the DC/DC converter including the control device in accordance with that defined in claim 1 connected to the second terminal.

7. The switched electrical power supply system according to claim 6, wherein the DC/DC converter is of an insulated "flyback" type.

8. The switched electrical power supply system according to claim 6, wherein the DC/DC converter is of an insulated "forward" type.

9. The switched electrical power supply system according to claim 6, wherein the DC/DC converter is of a boost type.

10. The switched electrical power supply system according to claim 6, wherein the DC/DC converter is of a buck type.

11. A variable speed drive intended to control an electrical load, the variable speed drive comprising:
    a rectifier module intended to rectify an AC voltage provided by an electrical distribution network;
    a DC power supply bus connected to the rectifier module and comprising a first power supply line at positive electrical potential and a second power supply line at negative electrical potential between which is applied a main DC voltage provided by the rectifier module;
    a bus capacitor connected to the first power supply line and to the second power supply line;
    an inverter module comprising a plurality of switching transistors intended to convert the DC voltage available on the bus into a variable voltage destined for the electrical load; and
    the switched electrical power supply system in accordance with that defined in claim 7,
    wherein the first terminal of the switched electrical power supply system is connected to the first power supply line of the DC power supply bus and the second terminal of the switched electrical power supply system is connected to the second power supply line of the DC power supply bus.

12. The control device according to claim 1, further comprising at least one superimposed identical patterns, each pattern of the at least one superimposed identical patterns comprising:
    a third transistor provided with a gate connected to a first connection point and provided with a source connected to a second connection point, wherein
    a first added pattern is connected up by its second connection point to a drain of the second transistor and by its first connection point to the gate of the second transistor, and
    each additional pattern is connected up by its second connection point to the drain of the third transistor of a previous pattern and by its first connection point to the gate of the third transistor of the previous pattern.

13. The control device according to claim 1, wherein control assembly is connected in series with the second input terminal.

14. The control device according to claim 13, wherein the Zener diode is configured to limit a voltage across the first transistor.

15. The control device according to claim 14, wherein the Zener diode is further configured to route a voltage of the voltage source to the gate of the second transistor when the control device is turned off.

16. The control device according to claim 1, wherein the voltage source guarantees a minimum voltage for control of the second transistor.

17. The control device according to claim 1, wherein the control unit is not connected to the voltage source.

* * * * *

UNITED STATES PATENT AND TRADEMARK OFFICE
CERTIFICATE OF CORRECTION

PATENT NO. : 9,543,841 B2
APPLICATION NO. : 13/795319
DATED : January 10, 2017
INVENTOR(S) : Hocine Boulharts et al.

It is certified that error appears in the above-identified patent and that said Letters Patent is hereby corrected as shown below:

In the Specification

Column 5, Line 43, change "off" to --on--.

Column 5, Line 58, change "on" to --off--.

Column 6, Line 3, change "off" to --on--.

Column 6, Line 4, change "on" to --off--.

Column 6, Line 7, change "turn-off" to --turn-on--.

Column 6, Line 9, change "off" to --on--.

Column 6, Line 16, change "off" to --on--.

Column 6, Line 19, change "on" to --off--.

Column 6, Line 20, change "off" to --on--.

Column 6, Line 21, change "turn-on" to --turn-off--

Column 6, Line 32, change "on" to --off--.

Column 6, Line 33, change "on" to --off--.

Column 6, Line 34, change "on" to --off--.

Column 6, Line 37, change "on" to --off--.

Signed and Sealed this
Third Day of April, 2018

Andrei Iancu
*Director of the United States Patent and Trademark Office*

CERTIFICATE OF CORRECTION (continued)
U.S. Pat. No. 9,543,841 B2

Column 6, Line 64, change "on" to --off--.

Column 7, Line 3, change "off" to --on--.